United States Patent [19]
Jones, Jr. et al.

[11] Patent Number: 5,991,165
[45] Date of Patent: Nov. 23, 1999

[54] BOARD TO BOARD RF SHIELD WITH INTEGRATED CONNECTOR/CONNECTOR HOLDER AND METHOD

[75] Inventors: James H. Jones, Jr.; James D. MacDonald, Jr., both of Apex; Bart Peter Reier, Raleigh; Eric Richard Burgan, Raleigh; Patrick Edward Nixon, Raleigh, all of N.C.

[73] Assignee: Ericsson Inc., Research Triangle Park, N.C.

[21] Appl. No.: 08/772,766

[22] Filed: Dec. 24, 1996

[51] Int. Cl.$^6$ ....................................................... H05K 9/00
[52] U.S. Cl. ........................... 361/816; 361/800; 361/802; 439/66; 206/719
[58] Field of Search ..................................... 361/748, 751, 361/752, 757, 784, 791, 792, 796, 800, 816, 737, 802, 803; 439/66, 71, 607; 174/35 R, 35 MS; 235/492; 200/719

[56] References Cited

U.S. PATENT DOCUMENTS

| | | | |
|---|---|---|---|
| 3,816,911 | 6/1974 | Knappenberger | 29/626 |
| 4,647,124 | 3/1987 | Kandybowski | 439/71 |
| 4,843,313 | 6/1989 | Walton | 439/66 X |
| 5,231,274 | 7/1993 | Reynier et al. | 439/66 X |
| 5,412,340 | 5/1995 | Tanikoshi | 361/816 X |
| 5,490,043 | 2/1996 | Tan et al. | 361/818 |
| 5,500,779 | 3/1996 | Diel | 360/97.01 |
| 5,572,408 | 11/1996 | Anhalt et al. | 361/737 |
| 5,653,596 | 8/1997 | Banakis et al. | 439/64 |

*Primary Examiner*—Leo P. Picard
*Assistant Examiner*—Jayprakash N. Gandhi
*Attorney, Agent, or Firm*—Nixon & Vanderhye P.C.

[57] ABSTRACT

A shield for an electronic device having a pair of cooperating printed circuit boards includes an integrated connector for connecting the printed circuit boards. The shield is provided with a frame attachable between the circuit boards and structure attached to the frame for supporting a connector that electrically connects the circuit boards. In one embodiment, the contacts of the connector are embedded in a sub-frame attached to the frame. In another embodiment, a connector holder is formed with the frame for supporting a connector that connects the printed circuit boards. By virtue of the unitary structure, problems associated with tolerance stack-up can be eliminated, and usable printed circuit board area can be maximized.

14 Claims, 3 Drawing Sheets

BOARD TO BOARD RF SHIELD WITH INTEGRATED CONNECTOR/CONNECTOR HOLDER AND METHOD

BACKGROUND

The present invention relates to shielding and electrical connection between boards in a dual printed circuit board assembly and, in particular, to a board to board RF shield with an integrated board to board connector/connector holder.

In an electronic device utilizing dual printed circuit boards, it is essential to shield various sections of the board from one another. For example, in a cellular phone, the logic section of the boards must be shielded from the RF section of the boards. The dual printed circuit boards must also be electrically coupled.

Many different shielding methods and connection methods exist, however, these methods have typically been made via two or more separate and distinct components. One method of shielding is a simple soldered can. In this method, a metal stamping is drawn and then soldered around the perimeter of the can to the board. A second method of shielding involves the use of a dual material board to board shield that separates the boards at a given distance as well as providing necessary shielding. In this method, a solid plastic core is overmolded with an electrically conductive elastomeric. When placed between the two boards, the elastomeric is compressed until the boards bottom out against the plastic core. Because the parts are molded, they can be of very complex shapes, typically of the board outline with dividers for the various sections on the boards. A third type of shielding between boards that has been used is a metallized injection molded plastic piece. Like the second method, this type of rigid construction also serves as a spacer between the boards. In some cases, small springs are clipped onto the molded piece between the mating surfaces to ensure proper contact and shielding.

Typically, the connection between the printed circuit boards is made with a separate connector assembly. Standard connector assemblies include male and female mating connectors, elastomeric connectors with separate holders and spring contact connectors. A standard surface mount connector is a two part component that depends on the manufacturing process to mate it properly. Misalignment can occur in both the X and Y plane and in the θ direction (θ is defined to be a rotation of the connector using its center as point of reference). A connector, whether surface mount or elastomeric, requires both boards to be aligned as accurately as possible. The elastomeric connectors and spring contact connectors have two alignment difficulties: first, shorting can result from the soldering mask rotating to cross two leads simultaneously, and second, noncontacts can occur when the leads do not touch the pad. Both of these problems are significant dangers and difficult to design around.

The prior art separate connector and shield arrangement disadvantageously takes up a significant amount of usable printed circuit board area. Moreover, with the conventional arrangements, the tolerance stack-up can be substantial, leading to problems with the final assembly. That is, if a pair of mating connectors is used in conjunction with a metallized plastic frame, which aligns the assembly, and the mated pair is soldered slightly out of line (but within tolerance), a large amount of stress could be placed on the connectors leading to field failures. Conversely, if the connectors are used to align the assembly, then the board edges may not align, and more space would be needed to house the dual board assembly, leading to a larger product. Still further, with larger tolerances required in the conventional assembly, the number of contacts in a given size connector is limited as the contacts must be sized sufficiently large enough to accommodate the tolerances.

SUMMARY OF THE INVENTION

It is therefore an object of the invention to provide a board to board shield that overcomes the drawbacks with conventional shields and separate connector assemblies. It is another object of the invention to provide a board to board shield having an integrated board to board connector/connector holder that minimizes the use of printed circuit board area, eliminates problems associated with tolerance stack-up, and includes an increased number of contacts. It is still another object of the invention to provide a method of manufacturing the board to board shield having an integrated board to board connector.

The invention thus is a board to board shield with an integrated board to board connector that does not have the problems of large printed circuit board area being lost and tolerance stack-up complications. The construction of the invention consists of a custom molded plastic frame (or die cast with an insulator at the contact for connections between boards) with a conductive ground to supply satisfactory shielding with an integrated connector support. The shield must be of such construction that the contacts for connections between boards do not come in contact with the electrical ground that supplies the board to board shielding. In one embodiment, the contacts are insert molded in the custom plastic frame or they can be inserted after the injection molded process. In another embodiment, the shield is molded with a connector holder that supports a connector having an increased number of contacts due to a tolerance reduction. Because a separate molded plastic container housing is not needed, printed circuit board area is saved. In addition, the tolerance stack-up is reduced because the contacts are part of the shield as opposed to a separate connector as in the prior art. Because there are no additional parts to solder, issues concerning alignment during solder placement are also eliminated. Good registration of the pads between the opposing boards can easily be obtained by placing alignment features in the custom molded plastic frame. The invention reduces the number of parts typically used in a dual board assembly, while saving space and eliminating tolerance accumulations.

In an exemplary embodiment according to the invention, there is provided a shield for an electronic device including a pair of cooperating printed circuit boards. The shield includes a frame attachable between the printed circuit boards, and structure attached to the frame for supporting a connector that electrically connects the pair of printed circuit boards. In one embodiment, the supporting structure includes a non-conducting sub-frame supporting a plurality of contacts, which are configured to electrically connect the pair of circuit boards. In this regard, the contacts may be embedded in the sub-frame. The frame is preferably formed of a conductive material, and the sub-frame is attached to the frame. In this context, the frame preferably includes an electrically conductive elastomeric, and the sub-frame is non-conductive molded plastic. Alternatively, the frame may include die cast metal and the sub-frame may be formed of an insulator. In still another arrangement, an electroplated layer of conductive material is placed on the sub-frame, and the sub-frame is formed of non-conductive plastic.

In a second embodiment, the supporting means includes a connector holder formed integral with the frame. In this regard, the frame is molded from a non-conductive material and includes a conductive material formed over the non-conductive material except in the vicinity of the connector holder. A connector may be disposed in the connector holder that includes a plurality of contacts configured to electrically connect the pair of circuit boards. Locating pins may be formed integral with the frame that are shaped to engage corresponding locating apertures in the pair of printed circuit boards.

The frame may additionally be provided with a conductive ground, and/or at least one cross member that shields one section of the pair of printed boards from another section of the pair of printed circuit boards.

In accordance with another aspect of the invention, there is provided a method of manufacturing a board to board RF shield for an electronic device. The method includes the steps of (a) forming a frame that is shaped to fit between a pair of printed circuit boards, and (b) forming structure attached to the frame that supports a connector for electrically connecting the pair of circuit boards. Step (b) may be practiced by forming a non-conducting sub-frame supporting a plurality of contacts, which are configured to electrically connect the pair of circuit boards. The method may still further include the step of embedding the contacts in the sub-frame. Step (b) may be practiced by forming the structure attached to the frame that supports the connector integral with the frame. Step (b) may alternatively be practiced by forming a connector holder integral with the frame. In this regard, the frame is preferably molded from a non-conductive material and includes a conductive material formed over the non-conductive material except in the vicinity of the connector holder.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

Figure 1:
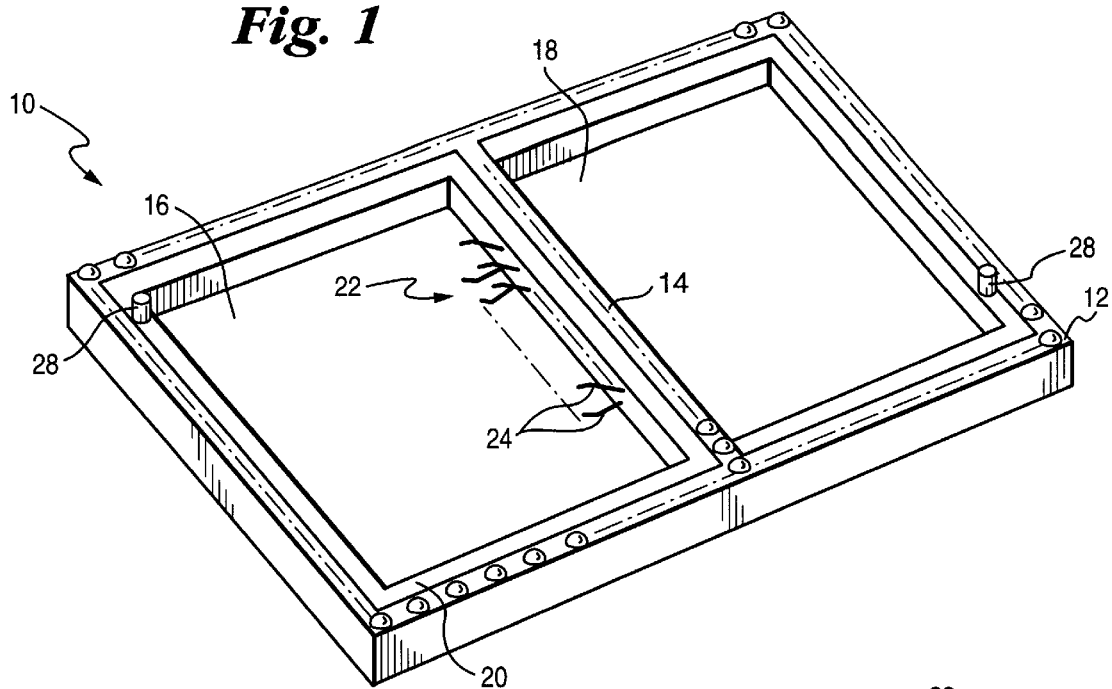
FIG. 1 is a perspective view of a first embodiment board to board shield with integrated connector according to the present invention.

FIG. 1 is a perspective view of a first embodiment according to the present invention. The board to board shield 10 includes a frame 12 that is attachable between overlayed the printed circuit boards of a dual circuit board electronic apparatus. The frame 12 is shaped corresponding to the shape of the printed circuit boards. The frame 12 includes at least one cross-member 14 and is formed of an electrically conductive material such as an electrically conductive elastomeric, thus serving as a conductive ground for the printed circuit boards. The cross-member 14 shields one section of the printed circuit boards, such as the logic section 16, from another section of the printed circuit boards, such as the RF section 18.

Figure 2:
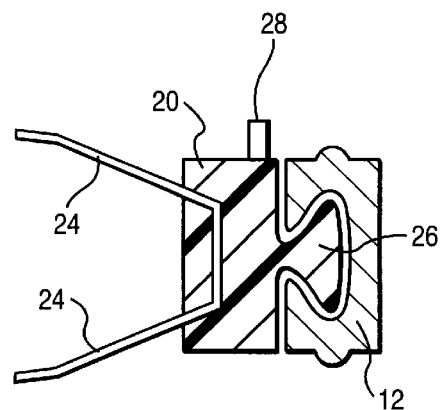
FIG. 2 is a cross-sectional view of the shield illustrated in FIG. 1.

The shield 10 also includes at least one sub-frame 20 attached to the frame 12 that supports a connector 22 electrically connecting the pair of printed circuit boards. In the embodiment shown in FIG. 1, the connector 22 includes a plurality of contacts 24 that are embedded in the sub-frame 20. The contacts can be insert molded in the sub-frame or they can be inserted after the injection molding process. The sub-frame 20 is preferably formed of a non-conducting material such as plastic or other insulator and is attached to the frame 12 in any suitable manner. As shown in FIG. 2, the sub-frame 20 is attached to the frame 12 with a tab and slot arrangement 26. Alternatively, the sub-frame 20 is secured to the frame 12 when the frame 12 is overmolded.

The frame is provided with alignment features such as locating pins 28 molded into the sub-frame. A complementary alignment feature, such as a hole, is provided on the printed circuit boards, thereby reducing tolerance stack-up and ensuring good registration of pad to pad contact from board to board. Moreover, with this arrangement, a separate connector assembly connecting the printed circuit boards is not needed.

Figure 3:
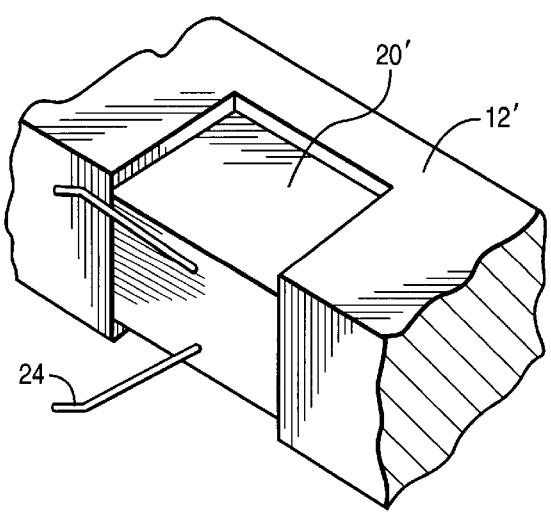
FIG. 3 is a perspective view of an alternative construction for the shield illustrated in FIG. 1.
Figure 4:
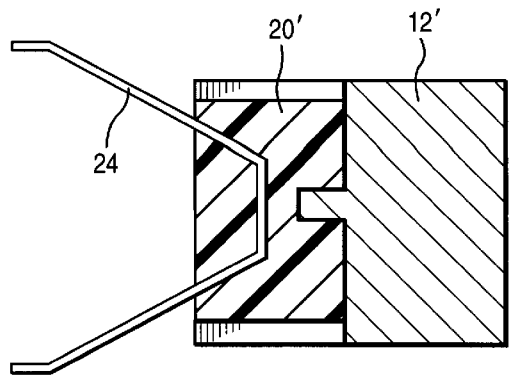
FIG. 4 is a cross-sectional view of the arrangement shown in FIG. 3.
Figure 5:
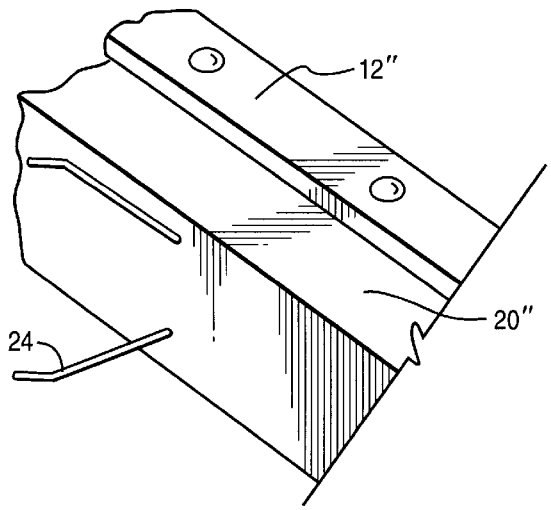
FIG. 5 is another alternative construction of the shield illustrated in FIG. 1.
Figure 6:
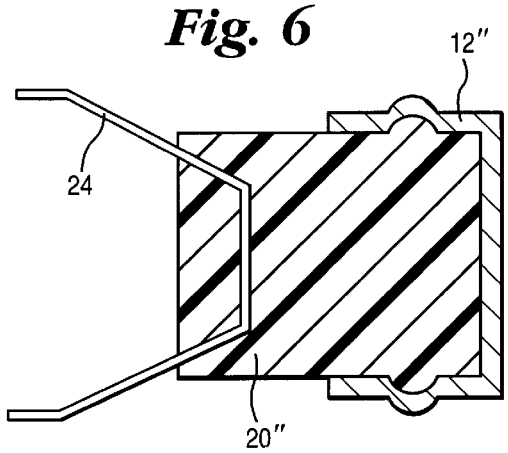
FIG. 6 is a cross-sectional view of the arrangement shown in FIG. 5.

Variations of the first embodiment are illustrated in FIGS. 3–6. FIGS. 3 and 4 show a die cast frame 12' formed of a conducting metal or the like coupled with an insulator forming the sub-frame 20'. In FIGS. 5 and 6, a plastic sub-frame 20" is selectively plated by a known electroplating process constituting the conducting frame 12". Typically, the sub-frame is formed in a molding process, and the contacts 24 are molded with the plastic sub-frame 20".

Figure 7:
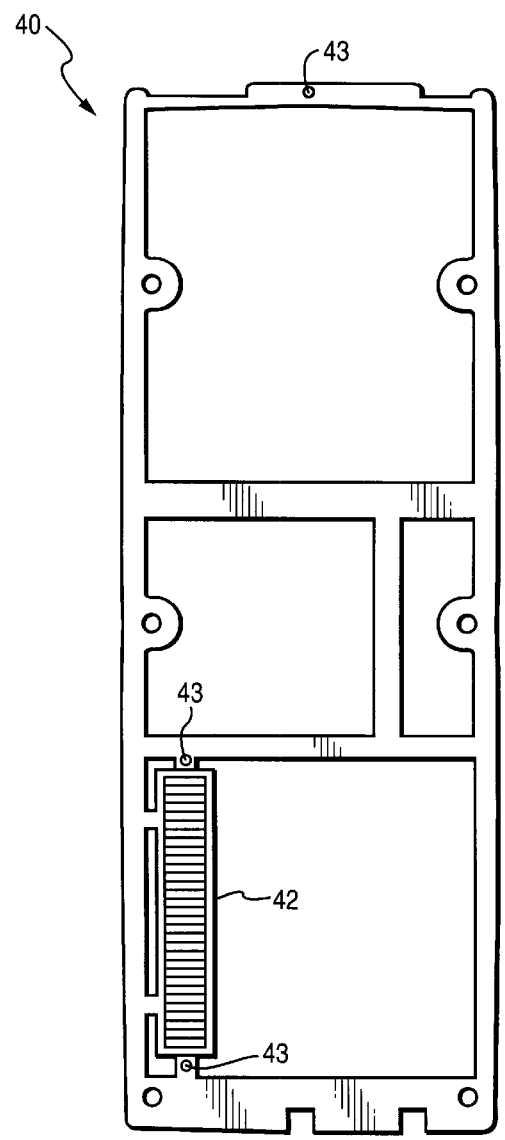
FIG. 7 illustrates a second embodiment board to board shield according to the present invention.
Figure 8:
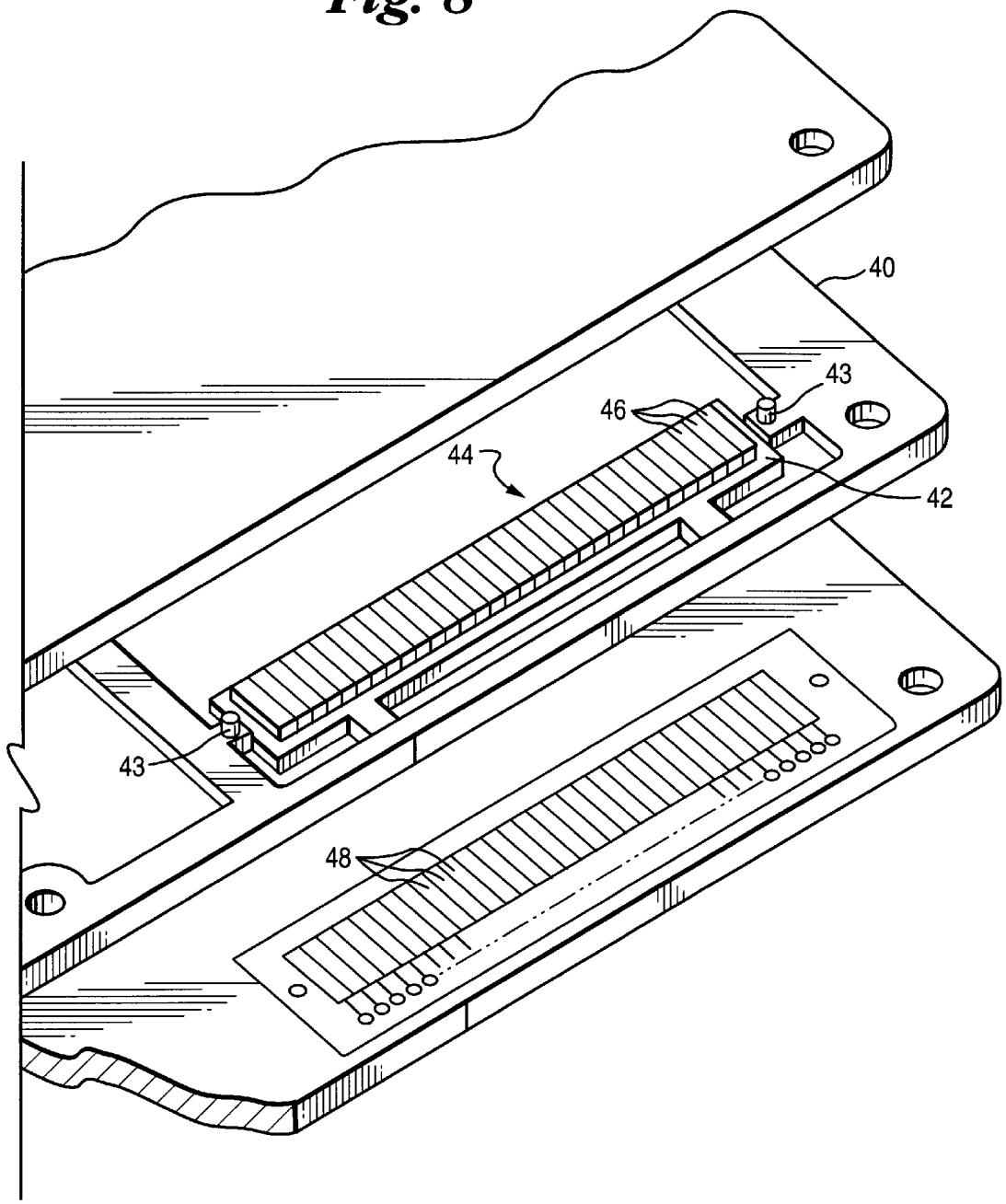
FIG. 8 is a perspective view of the shield shown in FIG. 7 including the printed circuit boards.

FIGS. 7 and 8 illustrate a second embodiment of the shield according to the present invention. In this embodiment, the frame 40 is molded with a non-conductive material such as plastic and includes a connector holder 42 attached thereto. The connector holder 42 is preferably formed integral with the frame 40. The plastic frame 40 is overmolded with a conductive EMI (electromagnetic interference) material except in the vicinity of the connector holder. The conductive material serves as a conductive ground for the printed circuit boards.

A conductive elastomeric electrical connector 44 is secured in the connector holder 42 for electrically connecting the printed circuit boards. The connector 44 includes a plurality of contacts 46 that contact electrical connection pads 48 on the printed circuit boards.

The frame 40 in this embodiment similarly includes alignment features such as locating pins 43 to ensure alignment of the shield between the printed circuit boards. The pins 43 surrounding the connector holder 42 are preferably larger in diameter and longer than the pin 43 disposed at the top portion of the frame 40 in FIG. 7. The larger pins serve to initially align the frame and ensure proper board to board connection. The smaller pin 43 enables the remaining assembly to close and adds rigidity to the frame. As a result of the alignment features, tolerance stack-ups are reduced enabling the pitch of the contacts in the connector to be reduced, thereby occupying less space than in the conventional arrangement. In the conventional apparatus, because of the various tolerances, the contacts of the connector and the electrical connection pads on the printed circuit boards, must be of sufficient size that proper contact will be made in the event that alignment is off, however within tolerance limits. The present structure enables tolerances to be reduced, thereby enabling reduced pitch contacts.

The structure according to the present invention provides a board to board RF shield having an integrated connector/connector holder for operatively connecting printed circuit boards in a dual printed circuit board electronic apparatus. By forming the connector assembly integral with the shield frame, problems associated with tolerance stack-up can be eliminated, and the amount of usable printed circuit board area can be maximized. The shield having an integrated board to board connector also requires fewer parts thus further reducing size and also reducing manufacturing costs.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A shield for an electronic device including a pair of cooperating overlayed printed circuit boards, the shield comprising:

a frame attachable between the overlayed printed circuit boards and including alignment means for aligning the frame between the overlayed printed circuit boards, said frame being formed of a conductive material serving as a conductive ground; and means attached to said frame for supporting a connector that electrically connects the pair of overlayed printed circuit boards.

2. A shield according to claim 1, wherein said supporting means comprises a non-conducting sub-frame supporting a plurality of contacts, said contacts being configured to electrically connect the pair of circuit boards.

3. A shield according to claim 2, wherein said frame comprises an electrically conductive elastomer, and wherein said sub-frame is non-conductive molded plastic.

4. A shield according to claim 2, wherein said frame comprises die cast metal, and wherein said sub-frame is formed of an insulator.

5. A shield according to claim 2, wherein said frame comprises an electroplated layer of conductive material on said sub-frame, and wherein said sub-frame is formed of non-conductive plastic.

6. A shield according to claim 1, wherein said supporting means comprises a connector holder formed integral with said frame.

7. A shield according to claim 6, wherein said frame is molded from a non-conductive material and comprises a conductive material formed over said non-conductive material except in the vicinity of said connector holder.

8. A shield according to claim 6, further comprising a connector disposed in said connector holder, said connector including a plurality of contacts configured to electrically connect the pair of circuit boards.

9. A shield according to claim 6, wherein said frame further comprises locating pins formed integral therewith, said locating pins being shaped to engage corresponding locating apertures in the pair of printed circuit boards.

10. A shield according to claim 1, wherein said frame comprises at least one cross member that shields one section of the pair of printed circuit boards from another section of the pair of printed circuit boards.

11. A shield according to claim 1, wherein said alignment means comprises at least one locating pin shaped to engage corresponding locating apertures in the pair of overlayed printed circuit boards.

12. A shield for an electronic device including a pair of cooperating printed circuit boards, the shield comprising:

a frame attachable between the printed circuit boards, said frame being formed of a conductive material serving as a conductive ground; and a non-conducting sub-frame attached to said frame and supporting a plurality of contacts, said contacts being configured to electrically connect the pair of circuit boards.

13. A shield according to claim 12, wherein said contacts are embedded in said sub-frame.

14. A shield for an electronic device including a pair of cooperating printed circuit boards, the shield comprising:

a frame attachable between the printed circuit boards, said frame being formed of a conductive material serving as a conductive ground; and a connector holder formed integral with said frame, said connector holder being configured to support a connector positioned between overlaying circuit boards for electrically connecting the overlaying circuit boards.

* * * * *